United States Patent
Yeh

(10) Patent No.: US 10,116,225 B1
(45) Date of Patent: Oct. 30, 2018

(54) GATE LINE DRIVE CIRCUIT AND DISPLAY DEVICE HAVING THE SAME

(71) Applicant: FocalTech Systems Co., Ltd., Hsinchu (TW)

(72) Inventor: Pi-Chun Yeh, Hsinchu (TW)

(73) Assignee: FOCALTECH SYSTEMS CO., LTD., Hsinchu (TW)

( * ) Notice: Subject to any disclaimer, the term of this patent is extended or adjusted under 35 U.S.C. 154(b) by 0 days.

(21) Appl. No.: 15/637,397

(22) Filed: Jun. 29, 2017

(30) Foreign Application Priority Data

Apr. 6, 2017 (TW) .............................. 106111576 A

(51) Int. Cl.
| | |
|---|---|
| H02M 3/337 | (2006.01) |
| G09G 3/36 | (2006.01) |
| H03K 17/0412 | (2006.01) |
| H02M 1/42 | (2007.01) |
| H03K 17/04 | (2006.01) |
| G09G 5/399 | (2006.01) |

(52) U.S. Cl.
CPC .......... *H02M 3/337* (2013.01); *G09G 3/3674* (2013.01); *G09G 5/399* (2013.01); *H02M 1/4225* (2013.01); *H03K 17/0406* (2013.01); *H03K 17/0412* (2013.01); *H03K 17/04123* (2013.01)

(58) Field of Classification Search
CPC .... H02M 3/337; H02M 1/4225; G09G 5/399; G09G 3/3674; H03K 17/0412; H03K 17/0406; H03K 17/04123
See application file for complete search history.

(56) References Cited

U.S. PATENT DOCUMENTS

| | | | | |
|---|---|---|---|---|
| 7,436,923 B2* | 10/2008 | Tobita | ................... | G11C 19/28 377/64 |
| 7,697,655 B2* | 4/2010 | Chan | ...................... | G11C 19/28 377/64 |

FOREIGN PATENT DOCUMENTS

| | | |
|---|---|---|
| TW | 201428728 A | 7/2014 |
| TW | 201629932 A | 8/2016 |

* cited by examiner

*Primary Examiner* — Jung Kim
(74) *Attorney, Agent, or Firm* — Muncy, Geissler, Olds & Lowe, P.C.

(57) ABSTRACT

A gate line drive circuit includes first, second and third transistors, and a boosting capacitor. The first transistor has a control terminal connected to a charge/discharge control signal of a previous-stage gate line drive circuit, a first terminal, and a second terminal connected to a control node. The second transistor has a control terminal connected to the control node, a first terminal, and a second terminal connected to a first timing signal. The third transistor has a control terminal connected to the control node, a first terminal, and a second terminal connected to a second timing signal. The boosting capacitor has one terminal connected to the control node, and the other terminal connected to the first terminal of the third transistor and a control terminal of a first transistor of a next-stage gate line drive circuit. The first terminal of the second transistor is connected to a gate line.

11 Claims, 11 Drawing Sheets

GATE LINE DRIVE CIRCUIT AND DISPLAY DEVICE HAVING THE SAME

BACKGROUND OF THE INVENTION

1. Field of the Invention

The present disclosure relates to the technical fields of display panels and, more particularly, to a gate line drive circuit and a display device having the same.

2. Description of Related Art

FIG. 1 is a schematic diagram of a typical gate line drive circuit. As shown on FIG. 1, the (n−1)-stage gate line drive circuit 110 generates an output signal Gn−1. The output signal Gn−1 is used not only to drive the (n−1)-th gate line 120, but also to control a transistor 131 of the n-stage gate line drive circuit 130. Similarly, the output signal Gn is used to drive the n-th gate line 140 and control transistor of the (n+1)-stage gate line drive circuit (not shown).

FIG. 2 is a timing diagram for a typical n-stage gate line drive circuit 130 shown in FIG. 1. As shown in FIG. 2, when the output signal Gn−1 is a high voltage, the transistor 131 is turned on. The U2D signal is a direct current (DC) high voltage signal, and thus the control node N of the n-stage gate line drive circuit 130 is charged to a first high voltage VGH1. When the output signal Gn−1 becomes a low voltage and the pull down unit is turned off, the voltage of the control node N is kept the first high voltage VGH1. At this moment, the transistor 133 is turned on and the clock signal CK at the source of the transistor 133 is changed from low voltage to high voltage. Due to the capacitor 134, the voltage of the control node N is boosted to a second high voltage VGH2. Furthermore, the transistor 133 is turned on, and the output signal Gn is pulled to high voltage for driving the n-th gate line 140 and simultaneously charging the control node N of the next-stage gate line drive circuit 130. Therefore, the duration of the output signal Gn is controlled by the clock signal CK.

As shown in FIG. 2, the duration of output signal Gn is a four-phase (4H); i.e., the duration of high voltage in the waveform of the output signal Gn is from time interval T4 to time interval T7. In time interval T7, the display data is written into the thin film transistors (TFTs) corresponding to the n-th gate line 140. There is a plurality of TFTs connected to the gate line, which increases the inductor and capacitor loading (LC loading) of the gate line. For driving the gate line with large LC loading, the output signal Gn is changed to high voltage in time interval T4.

However, as requirements of display quality become more strict, various methods to improve the display quality are needed, for example, one of them is to reduce the duration of the output signal Gn from four-phase (4H) to two-phase (2H). FIG. 3 is another timing diagram for a typical n-stage gate line drive circuit 130 shown in FIG. 1. The duration of the output signal Gn is changed to two-phase (2H).

As shown in FIG. 3, when the output signal Gn−1 is the high voltage, the transistor 131 is turned on. The U2D signal charges the control node N of the n-stage gate line drive circuit 130 to the first high voltage VGH1. In time intervals T4 and T5, the output signal Gn and clock signal CK are both in low voltage and the voltage of the control node N is kept only by the capacitor 134. If leakage current appears, the voltage of the control node N will be less than the first high voltage VGH1, as shown by the dotted ellipse in FIG. 3.

In time interval T6, the clock signal Ck is changed to high voltage and the voltage of the control node N is boosted. Due to the leakage current in time intervals T4 and T5, the voltage VGH2' of the control node N cannot be boosted to the second high voltage VGH2. The voltage VGH2' of the control node N is less than the second high voltage VGH2. The high voltage duration of the clock signal CK is only 2H (time intervals T6 and T7). When the transistor 133 is turned on, the clock signal CK charges the n-th gate line 140. Typically, the loading of the n-th gate line 140 will affect the waveform of the output signal Gn. When the clock signal CK only has two-phase (time intervals T6 and T7) for charging the n-th gate line 140, the rising edge and falling edge of the output signal Gn will be longer than the rising edge and falling edge of the output signal Gn in FIG. 2. When the number of transmission stages is getting increased, the waveform distortion of the output signal Gn becomes severer. As a result, the output signal Gn cannot be properly transmitted, and thus the gate line drive circuit breaks down. Accordingly, it is desirable to provide an improved gate line drive circuit to mitigate and/or obviate the afore-mentioned problems.

SUMMARY OF THE INVENTION

The aspect of the present disclosure is to provide a gate line drive circuit and a display device having the same. In the present disclosure, driving of the gate line is separate and independent from control of the next-stage gate line drive circuit so as to prevent the output signal from waveform distortion in multi-stage transmission. Since the gate line can be driven separately and independently from control of the next-stage gate line drive circuit, it is easier to adjust the duty cycle of the output signal and, in comparison with the prior art, the accuracy of timing control for the output signal can be increased so as to further improve the display quality of the display panel. Moreover, in the present disclosure, the transistor drives the gate line with current larger than that in the prior art, and thus the rising time or the falling time of the present disclosure is shorter than that of the prior art.

In accordance with one aspect of the present disclosure, a gate line drive circuit is provided, which comprises a first transistor, a second transistor, a third transistor and a boosting capacitor. The first transistor includes a control terminal connected to a charge/discharge control signal of a previous-stage gate line drive circuit, a first terminal connected to a charge high voltage, and a second terminal connected to a control node. The second transistor includes a control terminal connected to the control node, a first terminal, and a second terminal connected a first clock signal. The third transistor includes a control terminal connected to the control node, a first terminal, and a second terminal connected a second clock signal. The boosting capacitor includes a first terminal connected to the control node, and a second terminal connected to the first terminal of the third transistor. The first terminal of the third transistor is connected to a control terminal of a first transistor of a next-stage gate line drive circuit and the first terminal of the second transistor is connected to a gate line, such that driving of the gate line is separate and independent from control of the next-stage gate line drive circuit.

In accordance with another aspect of the present disclosure, a display device is provided, which comprises a display panel and a plurality of gate line drive circuits. The plurality of gate line drive circuits are used to drive the display panel for performing display operation. Each of the gate line drive circuits includes a first transistor, a second transistor, a third transistor, and a boosting capacitor. The first transistor includes a control terminal connected to a charge/discharge control signal of a previous-stage gate line drive circuit, a first terminal connected to a charge high voltage, and a second terminal connected to a control node. The second transistor includes a control terminal connected to the control node, a first terminal, and a second terminal connected a first clock signal. The third transistor includes a control terminal connected to the control node, a first terminal, and a second terminal connected a second clock signal. The boosting capacitor includes a first terminal connected to the control node, and a second terminal connected to the first terminal of the third transistor. The first terminal of the third transistor is connected to a control terminal of a first transistor of a next-stage gate line drive circuit and the first terminal of the second transistor is connected to a gate line, such that driving of the gate line is separate and independent from control of the next-stage gate line drive circuit.

Other objects, advantages, and novel features of the present disclosure will become more apparent from the following detailed description when taken in conjunction with the accompanying drawings.

DETAILED DESCRIPTION OF THE PREFERRED EMBODIMENT

The present disclosure will now be described in further detail with reference to the accompanying drawings and the accompanying embodiments, in which the objects, technologies and advantages of the present disclosure will become more clearly apparent. It is to be understood that the specific embodiments described herein are for illustrative purpose and are not intended to limit the disclosure.

Figure 4:
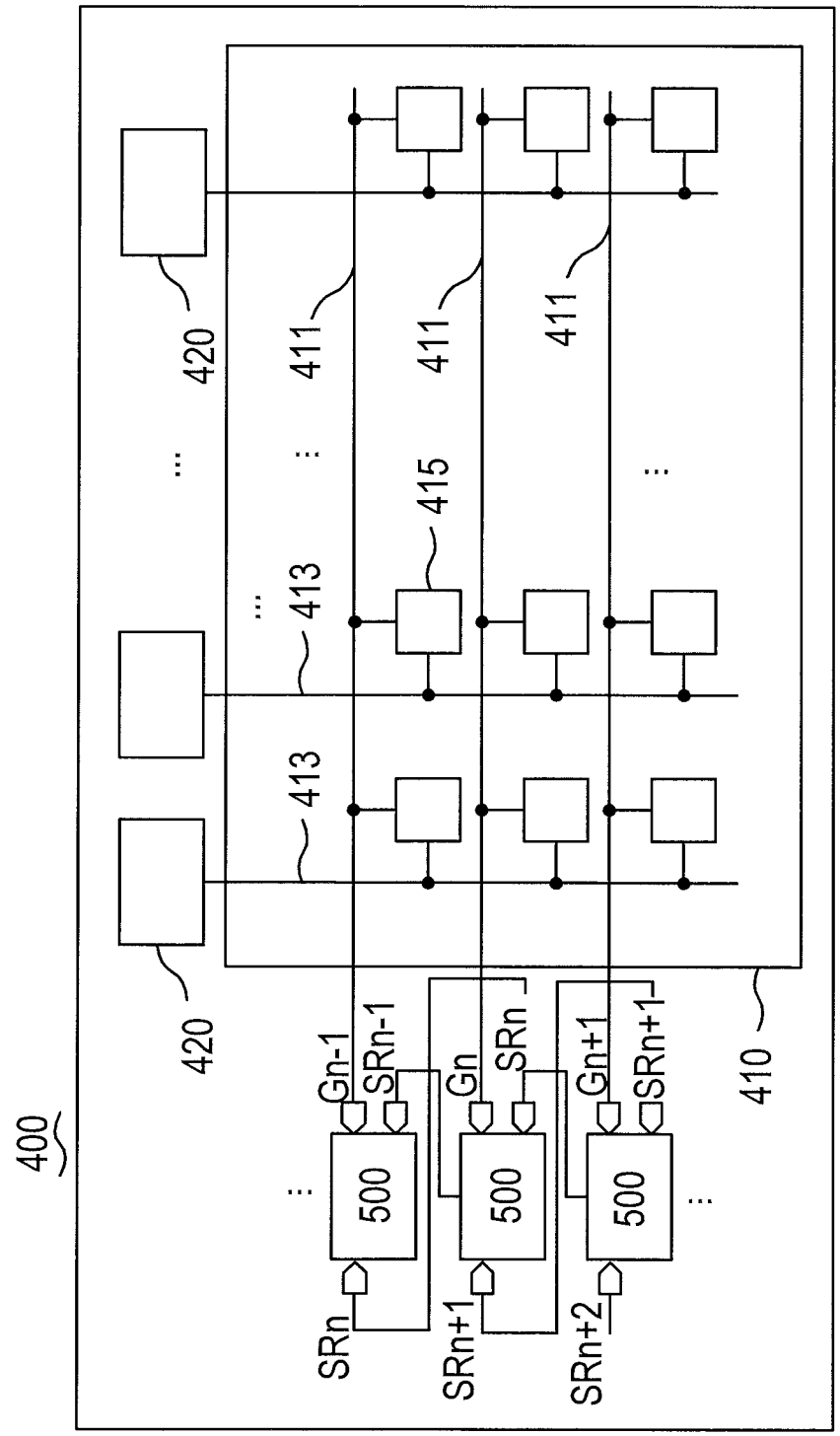
FIG. 4 is a schematic diagram of a display device in accordance with the present disclosure.

FIG. 4 is a schematic diagram of the display device 400 in accordance with present disclosure. The display device 400 includes a display panel 410, a plurality of data line drive circuits 420, and a plurality of gate line drive circuits 500. The display panel 410 includes a plurality of gate lines 411 and a plurality of data lines 413. Each gate line 411 intersects a data line 413 and there is a pixel 415 arranged at each intersection. The gate line drive circuits 500 sequentially drive the gate lines 411 to write pixel data into the corresponding pixels 415 by the data line drive circuits 420 for performing display operation on the display panel 410.

Figure 5:
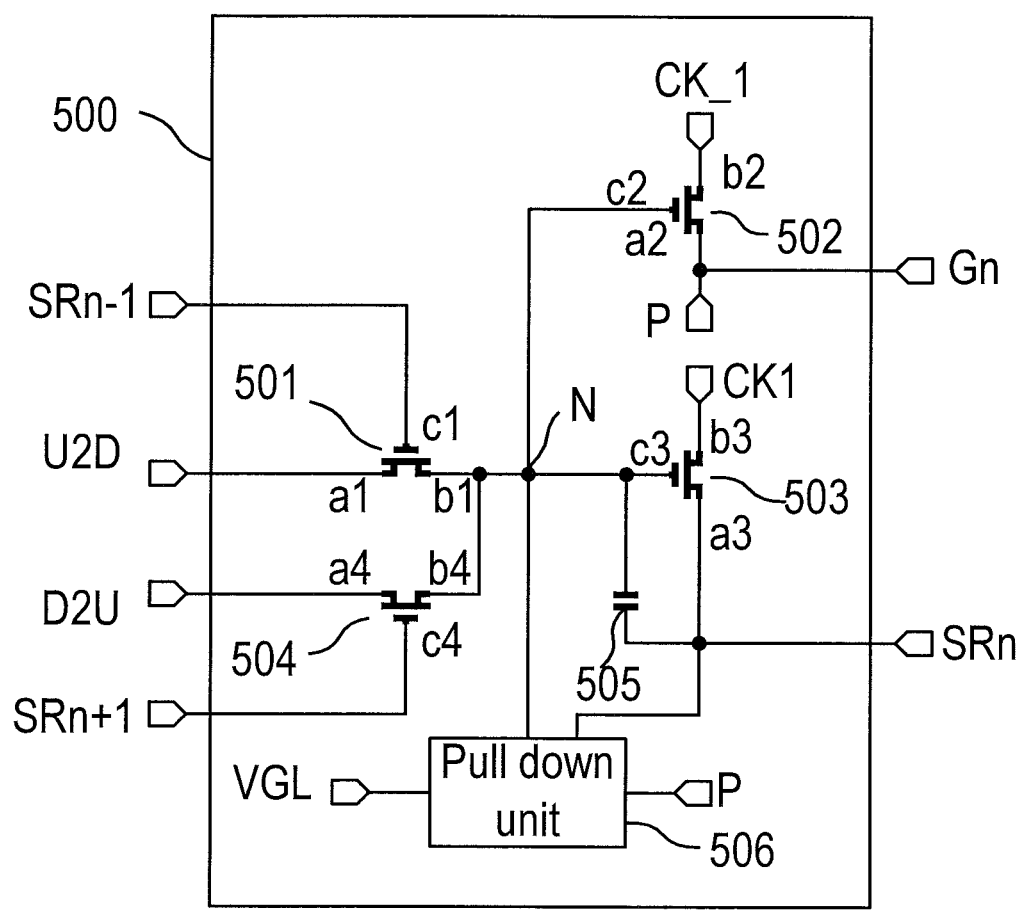
FIG. 5 is a schematic diagram of the gate line drive circuit in accordance with a first embodiment of the present disclosure.

FIG. 5 is schematic diagram of the gate line drive circuit 500 in accordance with a first embodiment of the present disclosure. The gate line drive circuit 500 includes a first transistor 501, a second transistor 502, a third transistor 503, a fourth transistor 504, a boosting capacitor 505, and a pull-down unit 506.

The first transistor 501 includes a control terminal c1 connected to a charge/discharge control signal SRn−1 of a previous-stage gate line drive circuit, a first terminal a1 connected to a charge high voltage U2D, and a second terminal b1 connected to a control node N.

The second transistor 502 includes a control terminal c2 connected to the control node N, a first terminal a2 connected to a gate line Gn, and a second terminal b2 connected a first clock signal CK_1. In the first embodiment of the present disclosure, the symbol Gn may represent a physical element, i.e. the gate line, or a signal on the physical element, i.e. the signal on the gate line. Such symbol representation is a habitual practice in electronic circuit drawings, and thus a detailed description therefor is deemed unnecessary.

The third transistor 503 includes a control terminal c3 connected to the control node N, a first terminal a3 connected to a first transistor of next-stage gate line drive circuit, and a second terminal b3 connected to a second clock signal CK1.

The boosting capacitor 505 includes a first terminal connected to the control node N, and a second terminal connected to the first terminal a3 of the third transistor 503. The fourth transistor 504 includes a control terminal c4 connected to a charge/discharge control signal SRn+1 of the next-stage gate line drive circuit, a first terminal a4 connected to a discharge low voltage D2U, and a second terminal b4 connected to the control node N.

The pull-down unit 506 is connected to the control node N, the first terminal a2 of the second transistor 502, and the first terminal a3 of the third transistor 503, so as to keep the control node N, the first terminal a2 of the second transistor 502, and the first terminal a3 of the third transistor 503 in a low voltage when the gate line drive circuit 500 is not in operation. In one embodiment, the pull-down unit 506 is a resistor or a diode-connected transistor, preferably.

Due to that the first terminal a3 of the third transistor 503 is connected to a control terminal of a first transistor of a next-stage gate line drive circuit, the gate line Gn is driven separately and independently from control of the next-stage gate line drive circuit. That is, the operation of the second transistor 502 for driving the gate line Gn is separate and independent from the operation of the third transistor 503 for controlling the next-stage gate line drive circuit, so as to more flexibly adjust the gate signal duration of the gate line Gn without affecting the driving of the gate line. In one embodiment, the first transistor 501, the second transistor 502, the third transistor 503, and the fourth transistor 504 are, but not limited to, N-type transistors.

Figure 6:
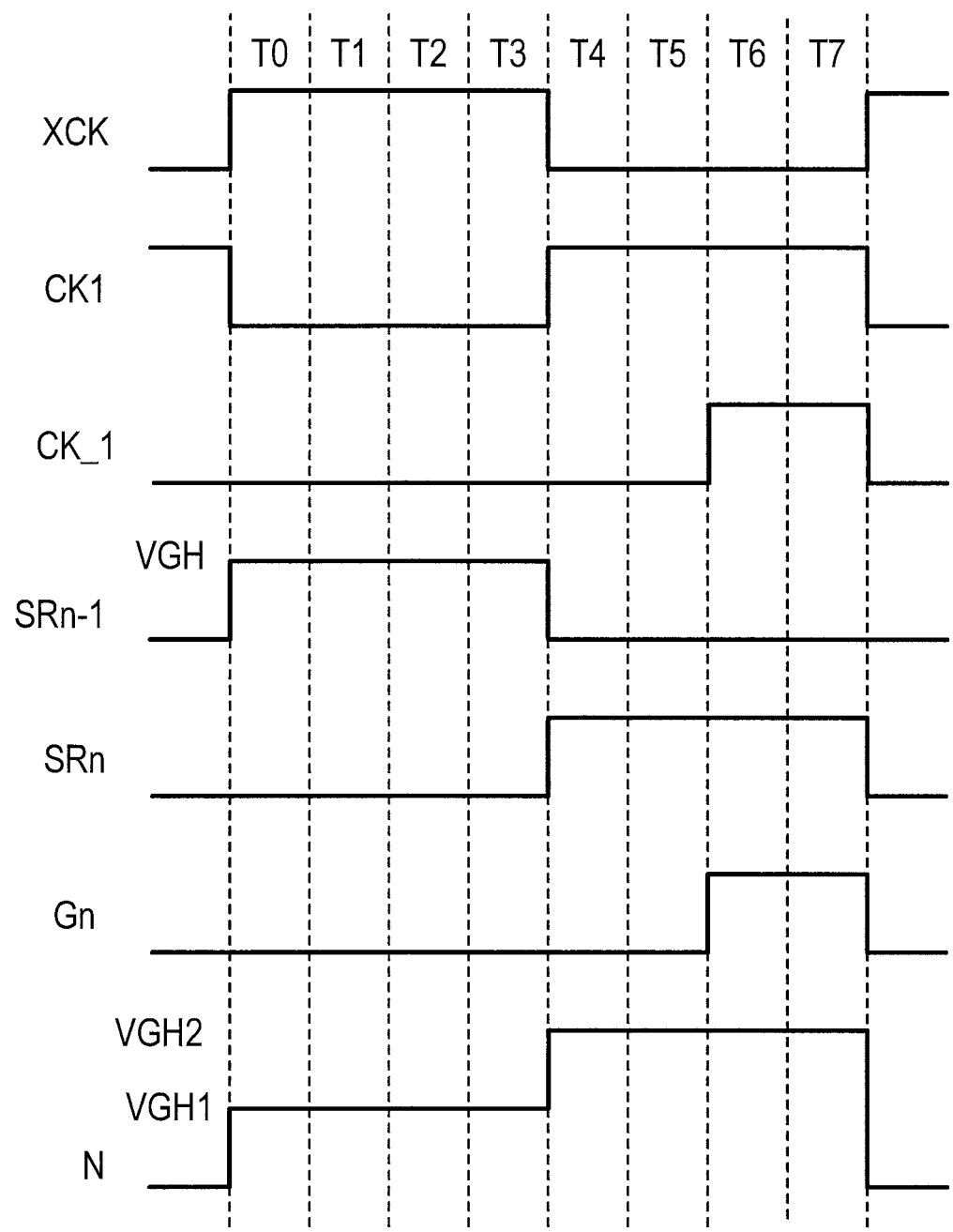
FIG. 6 is a timing diagram for the gate line drive circuit in accordance with the first embodiment of the present disclosure.

FIG. 6 is a timing diagram for the gate line drive circuit 500 in accordance with the first embodiment of the present disclosure. As shown on FIG. 6, when the charge/discharge control signal SRn−1 of a previous-stage gate line drive circuit is a control high voltage VGH, the first transistor 501 is turned on. Accordingly, a charge high voltage U2D charges the control node N, such that the voltage of the control node N rises up to a first high voltage VGH1. In the present disclosure, the voltage level of control high voltage VGH is the same as the voltage level of the first high voltage VGH1. In another embodiment, the voltage level of the control high voltage VGH may be greater than or less than the voltage level of the first high voltage VGH1.

At this moment, due to that the voltage of the control node N is the first high voltage VGH1, the second transistor 502 and the third transistor 503 are turned on, and thus the voltage of first terminal a2 of the second transistor is the same as that of the second terminal b2 of the second transistor 502 and the voltage of first terminal a3 of the second transistor is the same as that of the second terminal b3 of the second transistor 503. Due to that the second terminal b2 is connected to the first clock signal CK_1 and the first clock signal CK_1 is a low voltage VGL in time intervals T0 to T5, the output signal Gn is also the low voltage VGL in time intervals T0 to T5. Since the second terminal b3 is connected to the second clock signal CK1 and the second clock signal CK1 is the low voltage VGL in time intervals T0 to T3, the charge/discharge control signal SRn of the first terminal a3 is also the low voltage VGL in time intervals T0 to T3.

The second clock signal CK1 is changed to the high voltage in time intervals T4 to T7. Due to the boosting capacitor 505, voltage of the control node N is boosted to a second high voltage VGH2. In time intervals T4 to T7, the charge/discharge control signal SRn on the first terminal a3 is changed to the control high voltage VGH for charging the corresponding control node N of the next-stage gate line drive circuit. In time intervals T4 to T5, the output signal Gn is kept in low voltage VGL.

In time intervals T6 to T7, the voltage of the first clock signal CK_1 is changed to the control high voltage VGH, and thus the output signal GN is changed to the control high voltage VGH for driving the gate line 411 of the display panel 410, so as to enable the data line drive circuits 420 to write pixel data into the corresponding pixels 415 in time interval T7.

That is, in comparison with the prior art, with the second transistor 502 provided in the first embodiment of the present disclosure, the outputting of the output signal Gn of the gate line can be separated from the control of charging the corresponding control node in the next-stage gate line drive circuit. The gate of the second transistor 502 is connected to the control node N, the drain of the second transistor 502 is connected to the first clock signal CK_1, and the source of the second transistor 502 outputs the output signal Gn. The output signal Gn is provided to the gate line 411 of the display panel 410. The duration of the output signal Gn is controlled by the first clock signal CK_1. That is, the high voltage duration of the output signal Gn is controlled by the first clock signal CK_1. The drain of the third transistor 503 is connected to the second clock signal CK1 and the source of the third transistor 503 outputs the charge/discharge control signal SRn. The charge/discharge control signal SRn is outputted to the gate of a corresponding first transistor in the next-stage gate line drive circuit for turning on the corresponding first transistor in the next-stage gate line drive circuit, so as to charge the corresponding control node in the next-stage gate line drive circuit.

According to the gate line drive circuit 500 of the present disclosure, the charge/discharge control signal SRn controls the on duration of the corresponding first transistor for charging the control node in the next-stage gate line drive circuit. The duration of the charge/discharge control signal SRn is controlled by the second clock signal CK1. The on duration of the gate line Gn in the display panel is controlled by the first clock signal CK_1. The first clock signal CK_1 and the second clock signal CK1 may be separately and independently controlled, so as to maintain the operation margin of the original gate line drive circuit and to separately control the on duration of the gate line 411 in the display panel.

Figure 7:
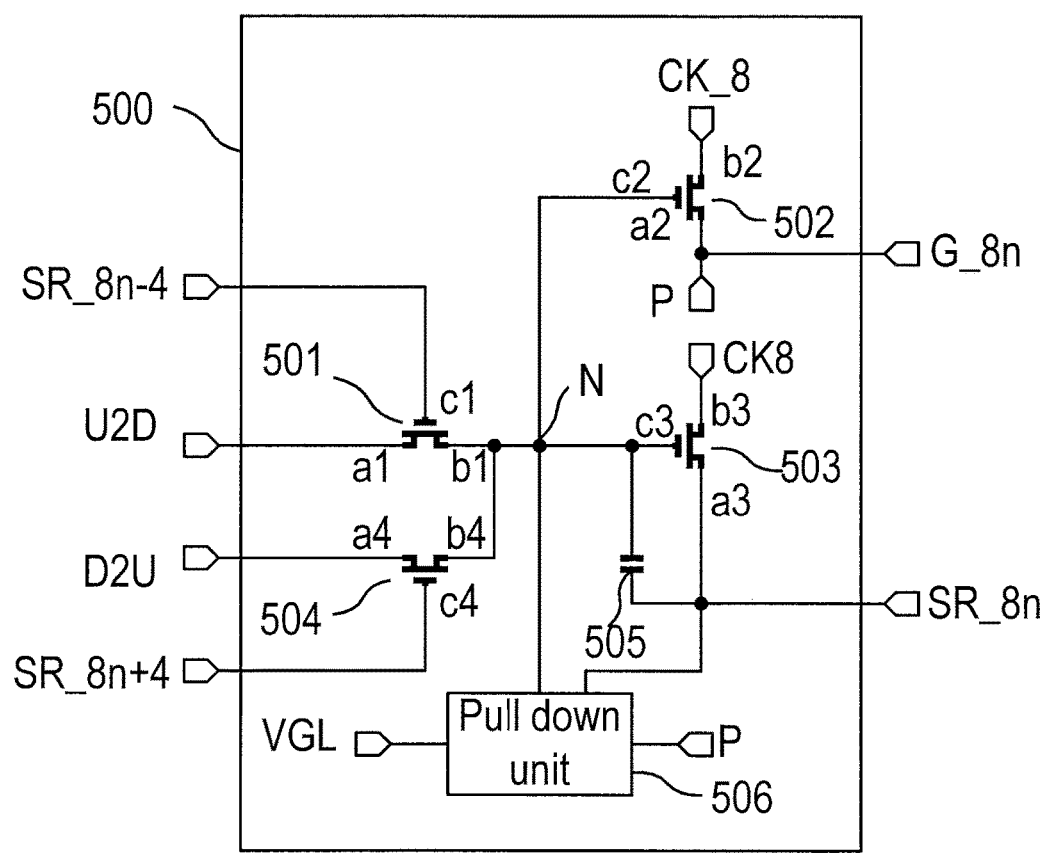
FIG. 7 is a schematic diagram of an eight-phase gate line drive circuit in accordance with the present disclosure.
Figure 8:
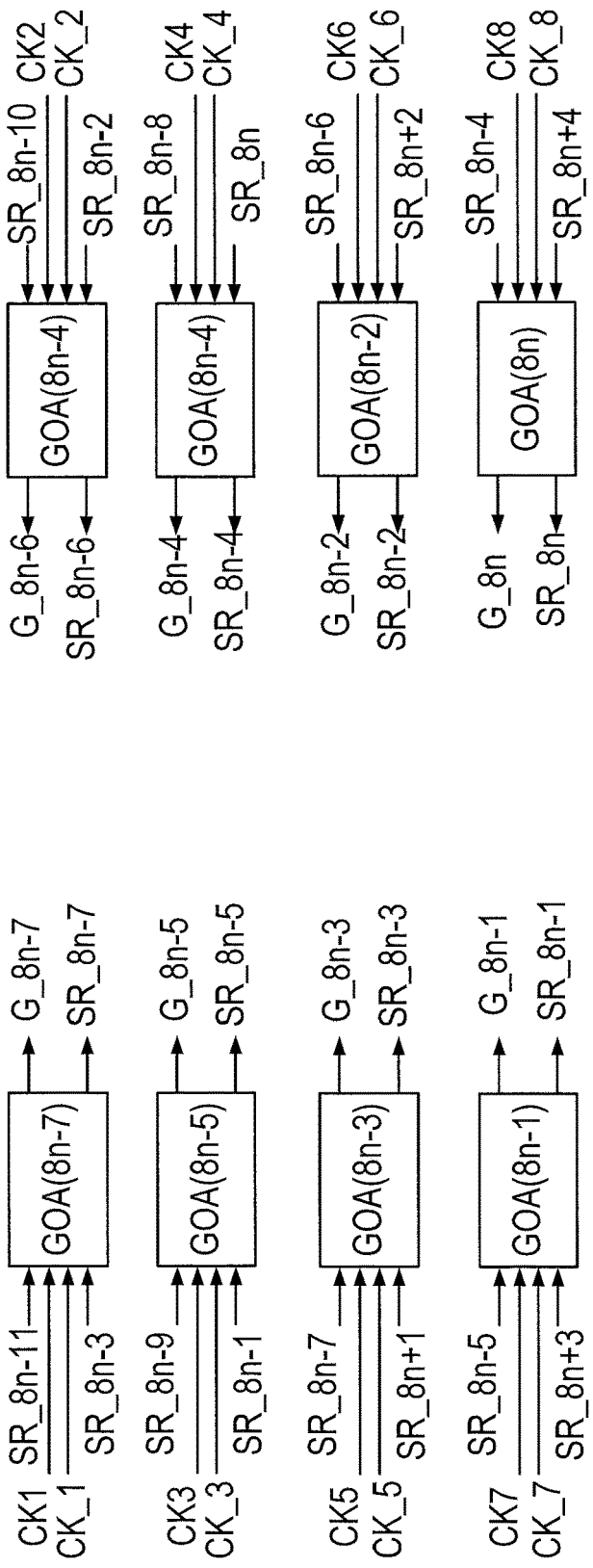
FIG. 8 is a schematic diagram illustrating the connection of the eight-phase gate line drive circuits in accordance with the present disclosure.

FIG. 7 is a schematic diagram of an eight-phase gate line drive circuit 500 in accordance with one embodiment of the present disclosure. FIG. 7 only shows the circuit diagram of one single eight-phase gate line drive circuit 500. FIG. 8 is a schematic diagram illustrating the connection of the eight-phase gate line drive circuits 500 in accordance with the embodiment of the present disclosure. In FIG. 8, GOA(8n) represents the eight-phase gate line drive circuit 500 in the n-th stage, GOA(8n−4) represents the eight-phase gate line drive circuit 500 in the (n−4)-th stage, and so on.

Figure 9:
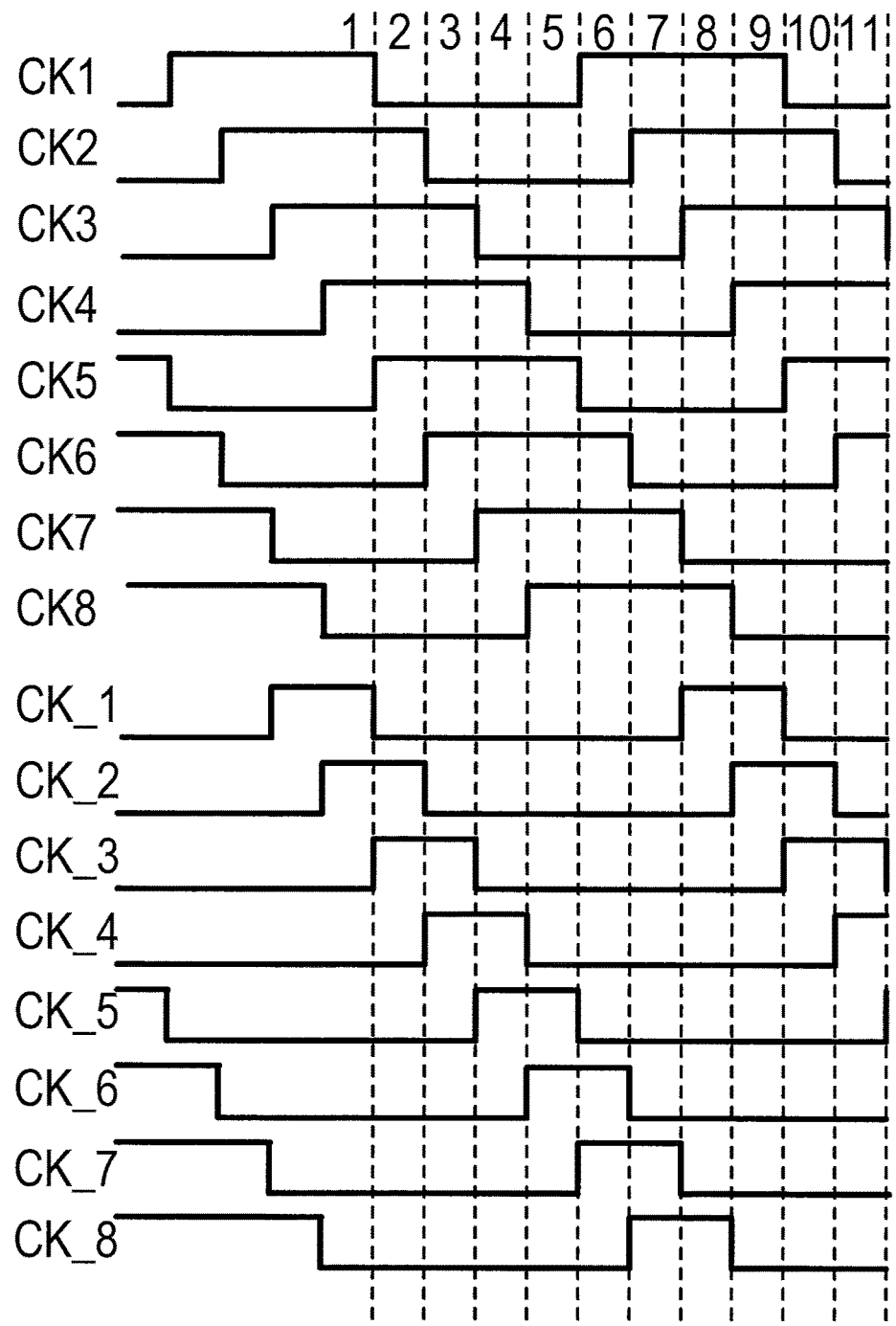
FIG. 9 is a timing diagram for the embodiment shown in FIG. 8 in accordance with the present disclosure.

The eight eight-phase gate line drive circuits 500 use eight phases as a cycle. That is, the gates of the first transistor 501 and the fourth transistor 504 of the n-th stage eight-phase gate line drive circuit 500 are respectively connected to the charge/discharge control signal SR_8n−4 of the (n−4)-th stage eight-phase gate line drive circuit 500 and the charge/discharge control signal SR_8n+4 of the (n+4)-th stage eight-phase gate line drive circuit 500. Each stage of the eight-phase gate line drive circuit 500 outputs respective output signal, such as G_8n, and the charge/discharge control signal, such as SR_8n+4. The operation of the remaining eight-phase gate line drive circuits 500 can be known with reference to FIG. 8. FIG. 9 is a timing diagram for the embodiment shown in FIG. 8 in accordance with present disclosure. In FIG. 9, the duration of the signal CKx is different from that of the signal CK_x, where x equals to 1, 2, 3, . . . , and 8. The duty cycle of the signal CKx is equal to 50% to ensure the operation margin of original gate line drive circuit. The duty cycle of the signal CK_x is less than 50% and can be adjusted freely in the range of being less than 50%. The duration of the output signal G_8n is determined by the duration of the corresponding signal CK_x.

Figure 10:
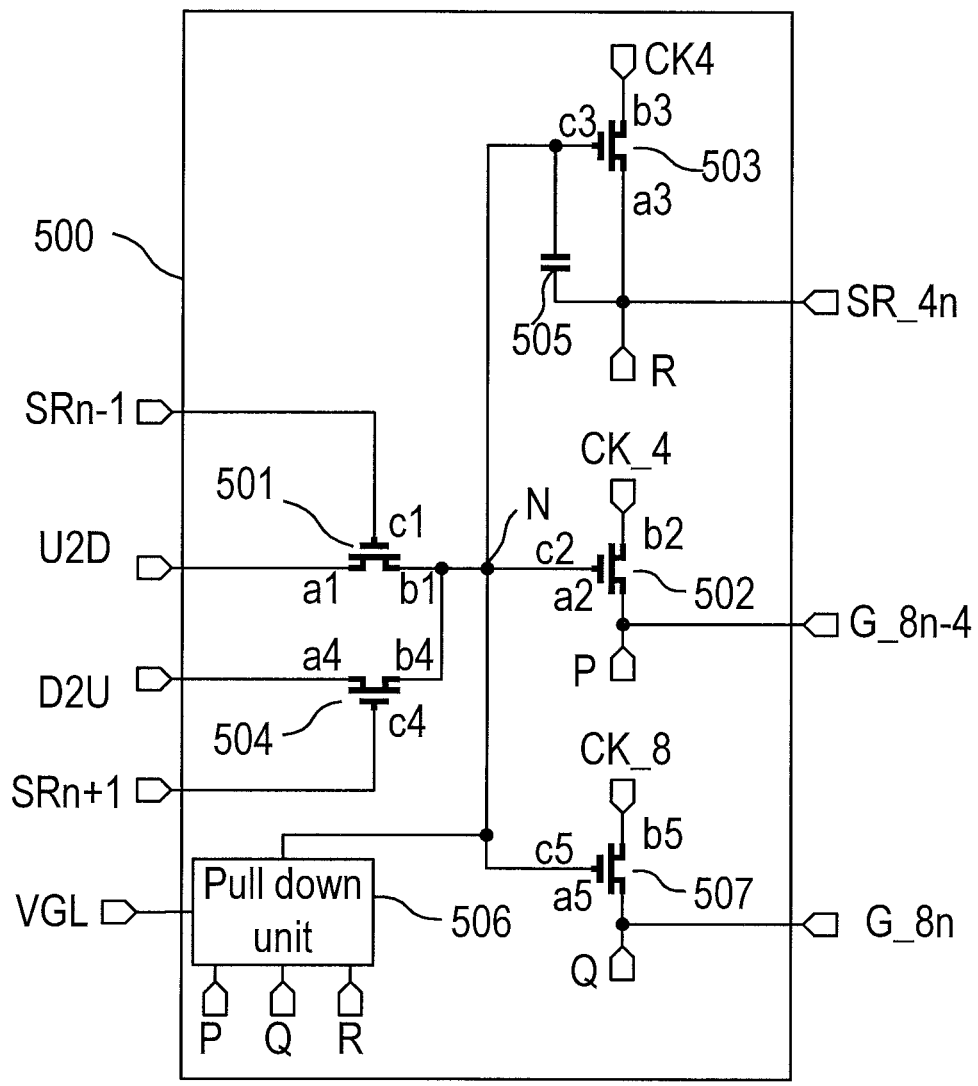
FIG. 10 is a schematic diagram of the gate line drive circuit in accordance with a second embodiment of the present disclosure.

FIG. 10 is a schematic circuit diagram of a gate line drive circuit 500 in accordance with a second embodiment of the present disclosure. In comparison with the first embodiment, the gate line drive circuit 500 in FIG. 10 is added with a fifth transistor 507. As shown in FIG. 10, the second terminal b3 of the third transistor 503 is connected to a second clock signal CK4. The second terminal b2 of the second transistor 502 is connected to a first clock signal CK_4. The fifth transistor 507 includes a control terminal c5 connected to the control node N, a first terminal a5, and a second terminal b5 connected to a third clock signal CK_8. In one embodiment of the present disclosure, the first transistor 501, the second transistor 503, the third transistor 503, the fourth transistor 504, and the fifth transistor 507 are, but not limited to, N-type transistors.

Figure 11:
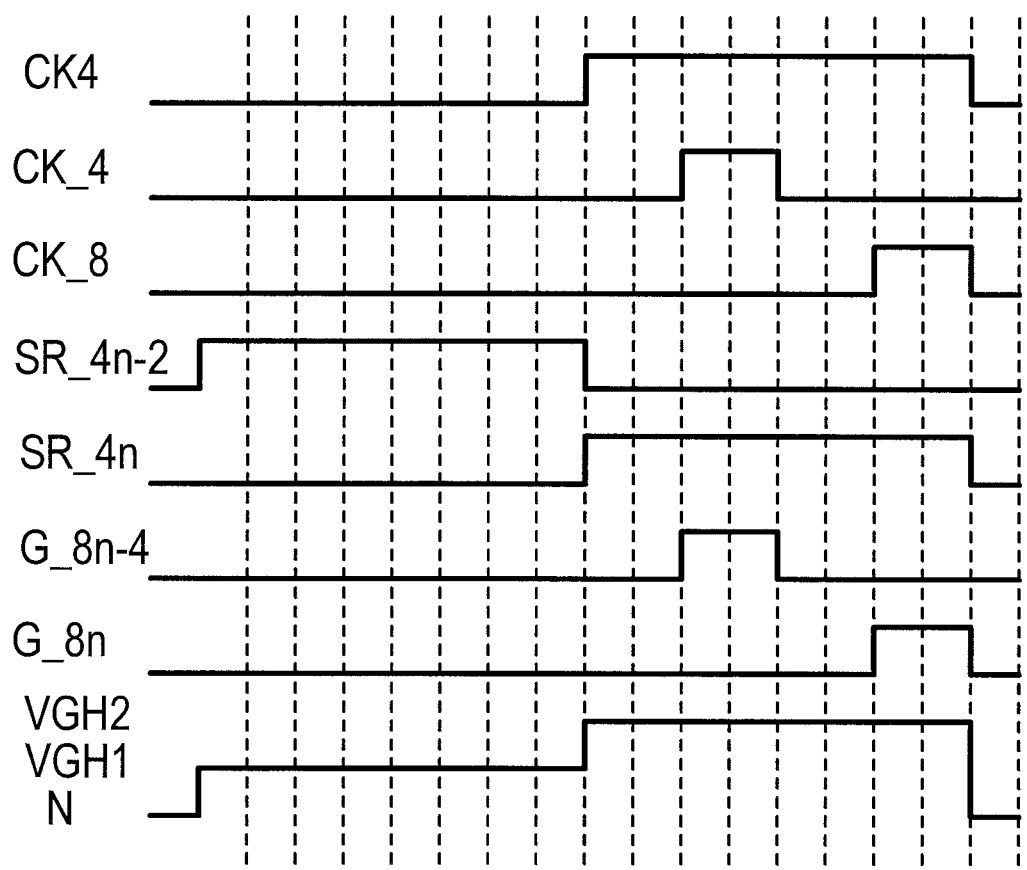
FIG. 11 is a timing diagram for the gate line drive circuit shown in FIG. 10 in accordance with the present disclosure.

In FIG. 10, there are two nodes labeled with P, indicating that the two nodes are electrically connected together, which is a habitual practice in electronic circuit drawings and thus a detailed description therefor is deemed unnecessary. FIG. 11 is a timing diagram for the gate line drive circuit 500 shown in FIG. 10 in accordance with the second embodiment of the present disclosure. The operation of FIG. 11 can be known with reference to FIG. 6 and its related description, and thus a detailed description therefor is deemed unnecessary.

Figure 1:
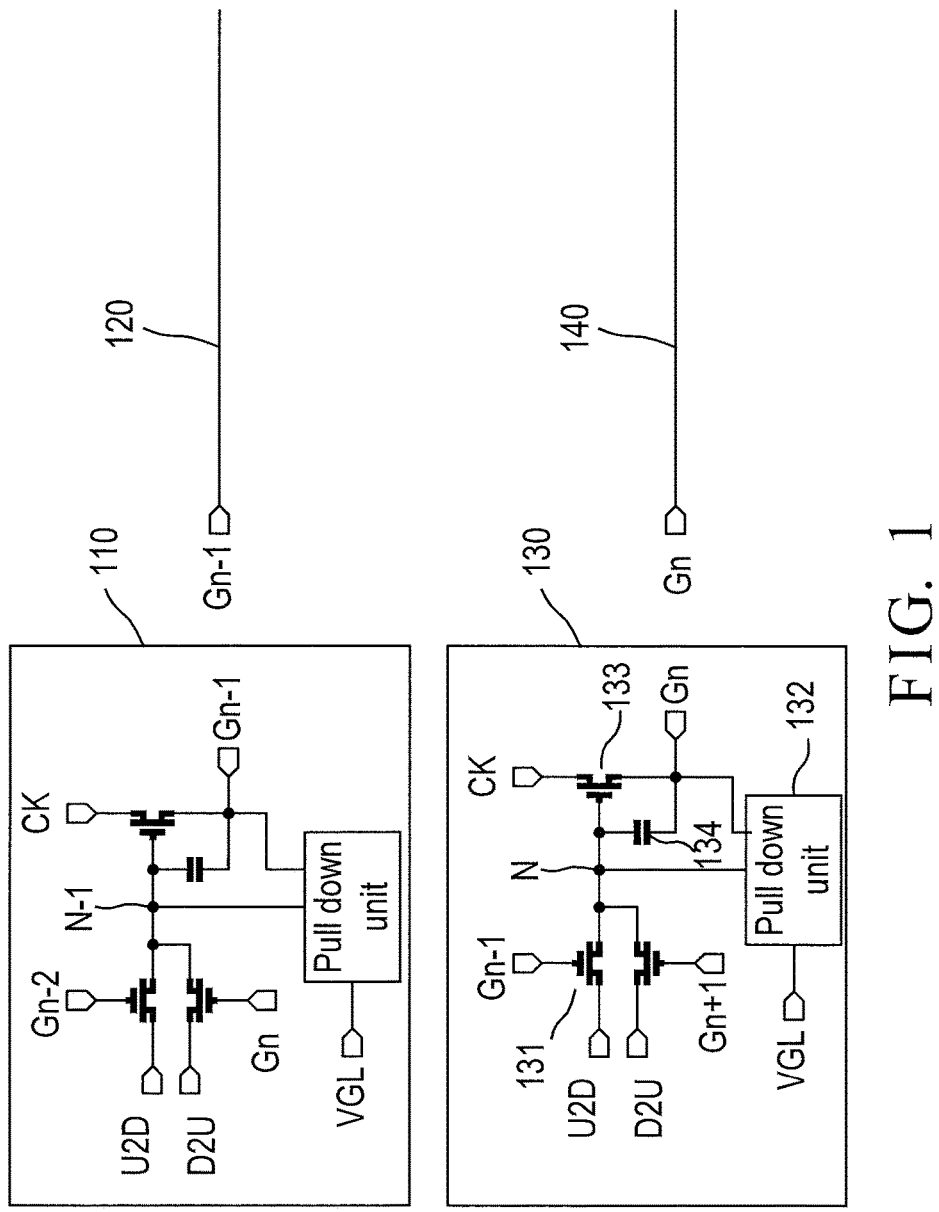
FIG. 1 is a schematic diagram of a typical gate line drive circuit.
Figure 2:
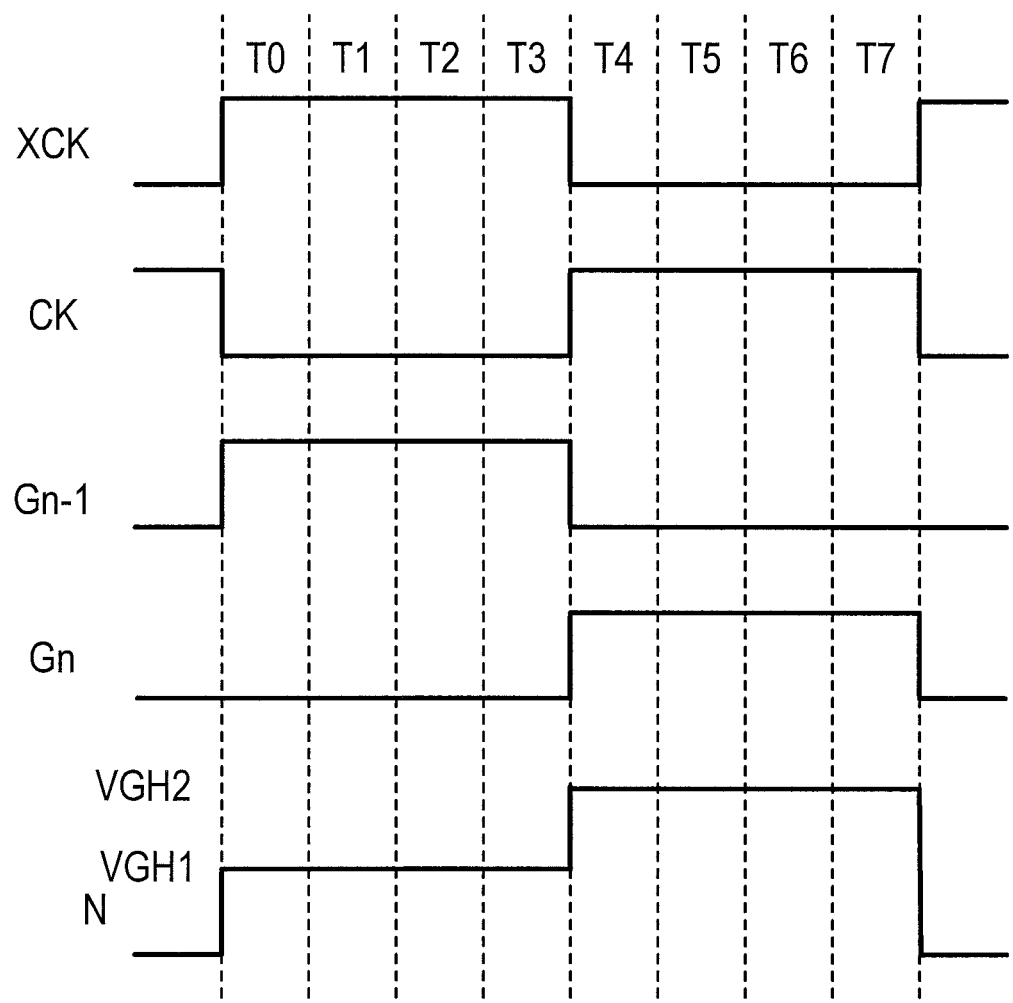
FIG. 2 is a timing diagram for a typical n-stage gate line drive circuit shown in FIG. 1.
Figure 3:
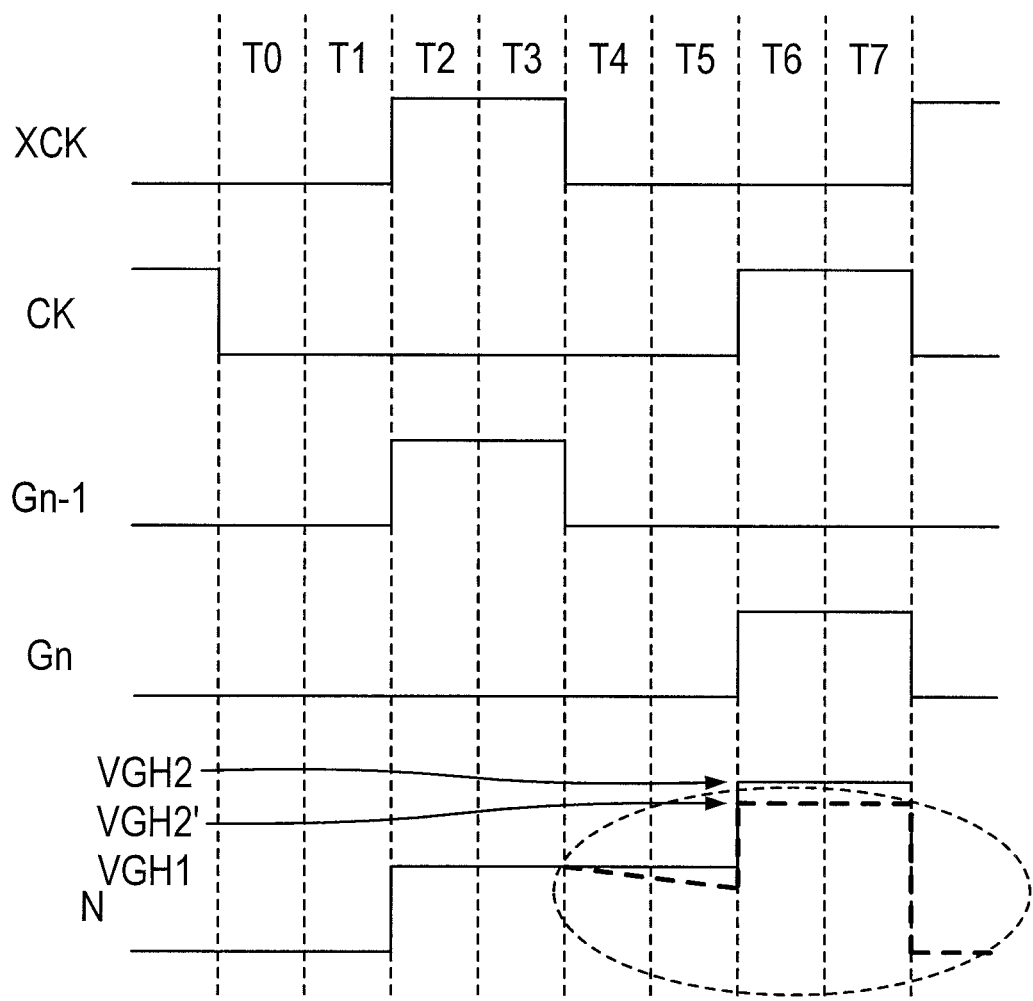
FIG. 3 is another timing diagram for a typical n-stage gate line drive circuit shown in FIG. 1.

From the comparison of FIG. 6 with FIG. 3, when the duration of the output signal Gn is changed to two-phase (2H), the voltage of the control node N in FIG. 3 is VGH2' and the voltage of the control node N in FIG. 6 is VGH2, where voltage VHG2 is greater than voltage VGH2'. The current equation of a transistor is expressed as follows:

$$I=Kpn\times[V_{GS}-Vt]^2=Kpn\times[V_N-V_{Sn}-Vt]^2,$$

where $V_N$ is a voltage of the control node N, $V_{Sn}$ is the source voltage of the transistor 133 or the second transistor 502, Kpn is the transconductance parameter of the transistor 133 or the second transistor 502, Kpn is equal to ½×u× Cox×W/L, u is the mobility of the carrier, Cox is the oxide capacitance of the transistor 133 or the second transistor 502, and W/L is the transistor aspect ratio. Due to that the voltage (VGH2) of the control node N in FIG. 5 is greater than the voltage (VGH2') of the control node N in FIG. 1, the current flowing into the second transistor 502 is greater than the current flowing through the transistor 133. Therefore, in the present disclosure, the second transistor 502 drives the gate line with a current larger than that in the prior art. The rising time or the falling time of the output signal Gn in the present disclosure is shorter than that of the prior art.

In the present disclosure, the gate line is driven separately and independently from the control of the next-stage gate line drive circuit, and thus it can avoid and obviate the prior problem that waveform distortion of the output signal Gn is getting serious as the number of transmission stages increases. Due to that the gate line is driven separately and independently from the control of the next-stage gate line drive circuit, it is easier to adjust the duty cycle of the output signal Gn and, in comparison with the prior art, the accuracy of timing control for the output signal Gn can be increased so as to increase the display quality of the display panel.

Although the present disclosure has been explained in relation to its preferred embodiment, it is to be understood that many other possible modifications and variations can be made without departing from the spirit and scope of the disclosure as hereinafter claimed.

What is claimed is:

1. A gate line drive circuit, comprising:
   a first transistor including a control terminal connected to a charge/discharge control signal of a previous-stage gate line drive circuit, a first terminal connected to a charge high voltage, and a second terminal connected to a control node;
   a second transistor including a control terminal connected to the control node, a first terminal, and a second terminal connected to a first clock signal;
   a third transistor including a control terminal connected to the control node, a first terminal, and a second terminal connected to different from the first clock signal; and
   a boosting capacitor including a first terminal connected to the control node, and a second terminal connected to the first terminal of the third transistor,
   wherein the first terminal of the third transistor is connected to a control terminal of a first transistor of a next-stage gate line drive circuit, the control terminal of the first transistor of the next-stage gate line drive circuit is driven by the second clock signal, and the first terminal of the second transistor is connected to a gate line of a display panel, such that the gate line of the display panel corresponding to a current stage is driven by the first clock signal and separately and independently from control of the next-stage gate line drive circuit.

2. The gate line drive circuit as claimed in claim 1, further comprising:
   a fourth transistor including a control terminal connected to a charge/discharge control signal of the next-stage gate line drive circuit, a first terminal connected to a discharge low voltage, and a second terminal connected to the control node.

3. The gate line drive circuit as claimed in claim 2, further comprising:
   a pull-down unit connected to the control node, the first terminal of the second transistor, and the first terminal of the third transistor, so as to maintain the control node, the first terminal of the second transistor, and the first terminal of the third transistor in a low voltage when the gate line drive circuit is not in operation.

4. The gate line drive circuit as claimed in claim 2, wherein, when the charge/discharge control signal of the previous-stage gate line drive circuit is a control high voltage, the control node is in a first high voltage and, when the second clock signal is the control high voltage, the control node is in a second high voltage and the first terminal of the third transistor is in the first high voltage, where the second high voltage is greater than the first high voltage.

5. The gate line drive circuit as claimed in claim 4, wherein, when the first clock signal is the control high voltage, the first terminal of the second transistor is in the first high voltage such that the gate line is driven separately and independently from the control of the next-stage gate line drive circuit.

6. The gate line drive circuit as claimed in claim 2, further comprising:
   a fifth transistor including a control terminal connected to the control node, a first terminal connected to another gate line, and a second terminal connected to a third clock signal.

7. The gate line drive circuit as claimed in claim 6, wherein the first transistor, the second transistor, the third transistor, the fourth transistor, and the fifth transistor are N-type transistors.

8. The gate line drive circuit as claimed in claim 3, wherein the pull down unit is a resistor or a diode-connected transistor.

9. A display device, comprising:
   a display panel; and
   a plurality of gate line drive circuits for driving the display panel to perform display operation, each of the gate line drive circuits including:
   a first transistor including a control terminal connected to a charge/discharge control signal of a previous-stage gate line drive circuit, a first terminal connected to a charge high voltage, and a second terminal connected to a control node;
   a second transistor including a control terminal connected to the control node, a first terminal, and a second terminal connected to a first clock signal;
   a third transistor including a control terminal connected to the control node, a first terminal, and a second terminal connected to different from the first clock signal; and
   a boosting capacitor including a first terminal connected to the control node, and a second terminal connected to the first terminal of the third transistor,
   wherein the first terminal of the third transistor is connected to a control terminal of a first transistor of a next-stage gate line drive circuit, the control terminal of the first transistor of the next-stage gate line drive circuit is driven by the second clock signal, and the first terminal of the second transistor is connected to a gate line of the display panel, such that the gate line of the display panel corresponding to a current stage is driven by the first clock signal and separately and independently from control of the next-stage gate line drive circuit.

10. The display device as claimed in claim 9, further comprising:
a fourth transistor including a control terminal connected to a charge/discharge control signal of the next-stage gate line drive circuit, a first terminal connected to a discharge low voltage, and a second terminal connected to the control node.

11. A gate line drive circuit, comprising:
a first transistor including a control terminal connected to a charge/discharge control signal of a previous-stage gate line drive circuit, a first terminal connected to a charge high voltage, and a second terminal connected to a control node;
a second transistor including a control terminal connected to the control node, a first terminal for providing a gate line signal, and a second terminal connected to a first clock signal;
a third transistor including a control terminal connected to the control node, a first terminal for providing a drive signal, and a second terminal connected to different from the first clock signal; and
a boosting capacitor including a first terminal connected to the control node, and a second terminal connected to the first terminal of the third transistor,
wherein the first terminal of the third transistor is connected to a control terminal of a first transistor of a next-stage gate line drive circuit for outputting the drive signal to control the next-stage gate line drive circuit, and the first terminal of the second transistor is connected to a gate line of a display panel for outputting the gate line signal to control the gate line, where the drive signal is outputted earlier than the gate line signal, such that the gate line is driven separately and independently from control of the next-stage gate line drive circuit.

* * * * *